United States Patent [19]

Ahmed

[11] 4,039,857

[45] Aug. 2, 1977

[54] DYNAMIC BIASING OF ISOLATION BOAT INCLUDING DIFFUSED RESISTORS

[75] Inventor: Adel Abdel Aziz Ahmed, Annandale, N.J.

[73] Assignee: RCA Corporation, New York, N.Y.

[21] Appl. No.: 566,707

[22] Filed: Apr. 10, 1975

Related U.S. Application Data

[62] Division of Ser. No. 463,606, April 24, 1974.

[51] Int. Cl.² ............................................. H03K 19/12
[52] U.S. Cl. ................................... 307/213; 307/237; 307/297; 307/303; 357/40; 357/48; 357/51
[58] Field of Search ............... 307/303, 215, 218, 213, 307/259, 237, 297; 357/48, 51, 40

[56] References Cited

U.S. PATENT DOCUMENTS

| 3,252,006 | 5/1966 | Post | 357/21 |
| 3,671,783 | 6/1972 | Hampel et al. | 307/259 |
| 3,823,386 | 7/1974 | Gilbert | 307/303 |

Primary Examiner—John Zazworsky
Assistant Examiner—Marcus S. Rasco
Attorney, Agent, or Firm—H. Christoffersen; S. Cohen; A. Limberg

[57] ABSTRACT

A diode current steering network is fabricated in minimum area in a monolithic integrated circuit by dynamically biasing an isolation boat wherein are contained diffused resistors connected to the various circuit points to which current is to be steered.

7 Claims, 10 Drawing Figures

PLAN

SECTION A-A'

SECTION B-B'

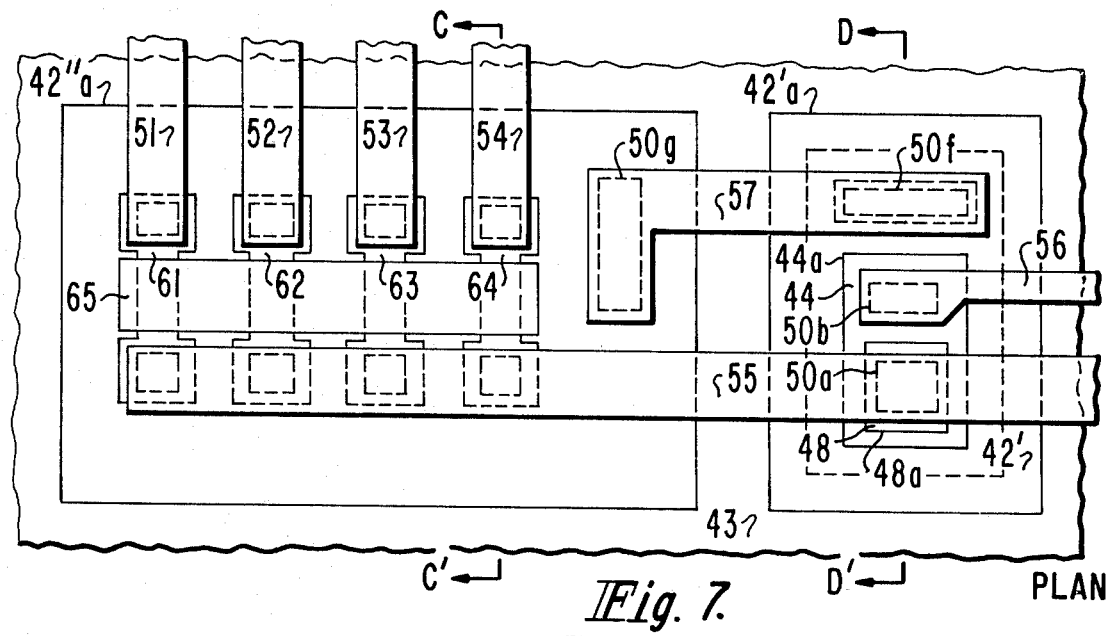
Fig. 7. PLAN
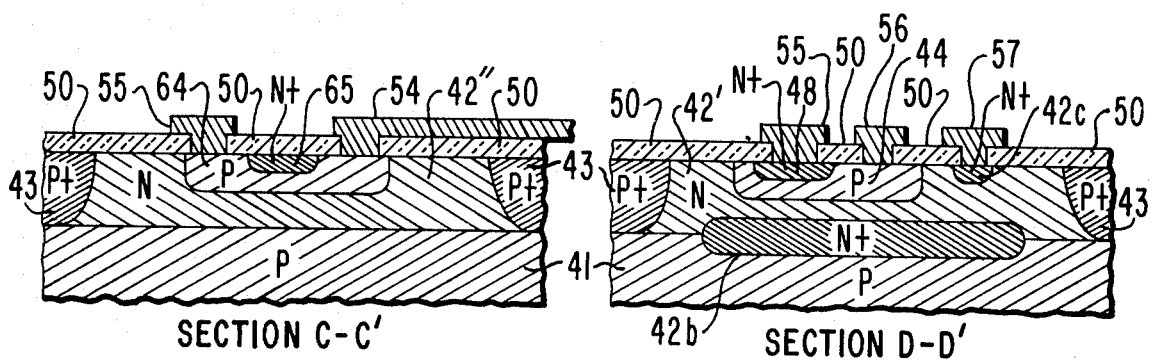
Fig. 8. SECTION C-C'
Fig. 9. SECTION D-D'
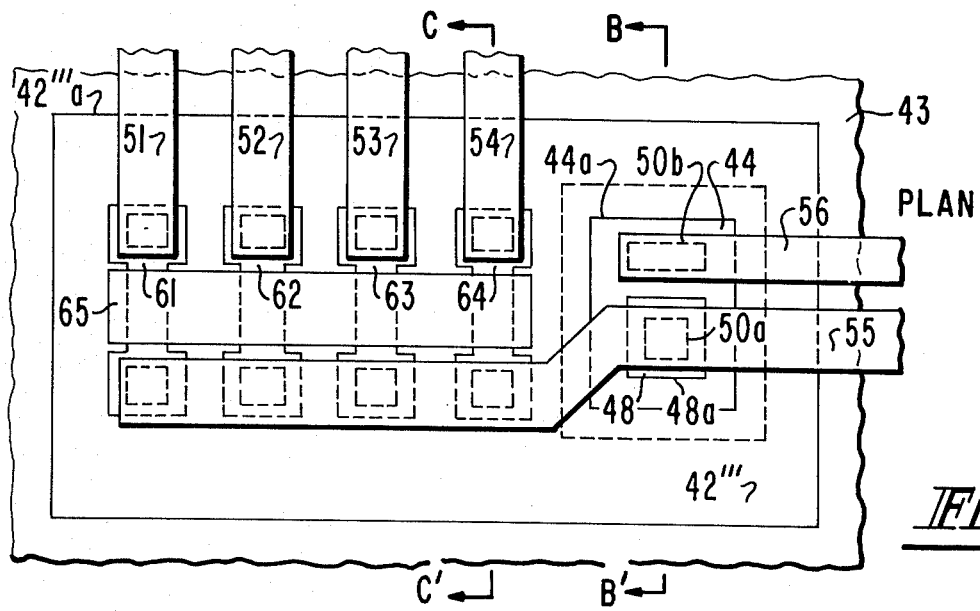
Fig. 10. PLAN

DYNAMIC BIASING OF ISOLATION BOAT INCLUDING DIFFUSED RESISTORS

This application is a divisional application based on and claiming the priority date of U.S. patent application Ser. No. 463,606 filed Apr. 24, 1974.

An inclusive OR gate in positive logic convention is a logic element in which the output signal is in a "high" condition when any of its input signals is in a high condition and in which the output signal is in a "low" condition when and only when all of its input signals are in a low condition. Often, these high and low conditions are expressed in terms of the binary numbers ONE and ZERO, respectively. ONE and ZERO are also sometimes referred to as logical 1 and logical 0, respectively. OR gates are well-known in which the low and high conditions of the input and output signals are each defined in terms of voltage levels. These prior art designs have a shortcoming insofar as their inclusion in a telephone cross-point system is concerned, in that their current demands tend to vary with operating potential. It is desirable, however, that the total current demand of the cross-point subsystems in a telephone switchboard or exchange be maintained within fairly tight limits. This is desirable insofar as permitting the use of protection circuits sensitive to over-current conditions indicative of a system fault to forestall extended damage to the system. At the same time, it is highly desirable from the standpoints of economy, reliability and compactness of the equipment to be able to dispense with regulation of the operating potentials supplied to the various portions of the system.

The operating potentials in a telephone switchboard or exchange are subject to variation. Since the operating currents required from the power supplies can not be completely determined, this will cause variation of the operating potentials provided by less than well-regulated power supplies. A-c power from the power line company mains is transformed in voltage, rectified and filtered to provide operating potentials under normal conditions of operation. Standby batteries are used to provide operating potentials under emergency conditions when mains power delivery is disrupted. As the stand-by batteries are discharged, the operating potentials which they supply decay. In cases where these stand-by batteries are not floated across the normal operating supply to provide regulation at the same time they are kept under continuous charge, there tends to be a change in supplied operating potential when the stand-by batteries are called into use. These circumstances make it desirable to use current-mode rather than voltage-mode OR gates in telephone circuitry.

Another important reason for using current-mode OR gates arises when their input signals are obtained from sensing the state of semiconductor controlled rectifiers (SCR's) used as cross-point switches. Since the SCR's are held in conduction by current supplied via the signal lines and the signal lines should be loaded as little as necessary, practically it is necessary to use high-impedance sensing means. The high source impedance presented to the OR gate by the sensing means makes current mode logic more practicable than voltage-mode logic.

A current-mode OR gate has its low or ZERO and high or ONE signal states defined in terms of current levels rather than voltage levels. In the present inventor's previous designs of integrated-circuit cross-point subsystems, the current-mode OR function is accomplished by the simple expedient of merely summing the input currents to form the output current. However, this expedient is satisfactory only as long as the sum of the maximum input current levels identified as ZERO's is substantially smaller than the minimum input current level recognized as a ONE.

Also, this prior art technique of simply summing input currents to perform the OR gate function is handicapped by the fact that the output current may become excessively large when many of the input currents are in their high state. That is, the output current is $n$ times as large as it needs to be to establish its high state where it is recognized as a ONE, $n$ being the number of input currents. When many OR gates are required in a system, this excessively large output current causes a needless drain on the operating power supplies.

U.S. Patent application Ser. No. 463,606 filed Apr. 24, 1974, concerns a current-mode OR gate which has a separate threshold detection circuit for determining whether each of the input currents to the OR gate is in its high or its low state. This permits the gate to better distinguish when only one of its input signals is a ONE from a condition in which all of its input signals are ZERO but their sum can be as large as the single input ONE current—as, for example, because of noise and leakage currents accompanying the input currents. The current-mode OR gate also includes means for regulating its output current to a uniform ONE level, whether in response to one or to more of its input signals being a ONE.

The present invention concerns operation of an integrated-circuit structure—suitable for implementing a current-mode OR gate of the foregoing type, for example—wherein there is dynamic biasing of an isolation boat to obtain additional functions from the components disposed therein, as contrasted with the conventional practice of biasing the isolation boat at fixed potential. The dynamic isolation boat biasing technique is used for fabricating a diode steering network in minimum integrated circuit area.

Figure 6:
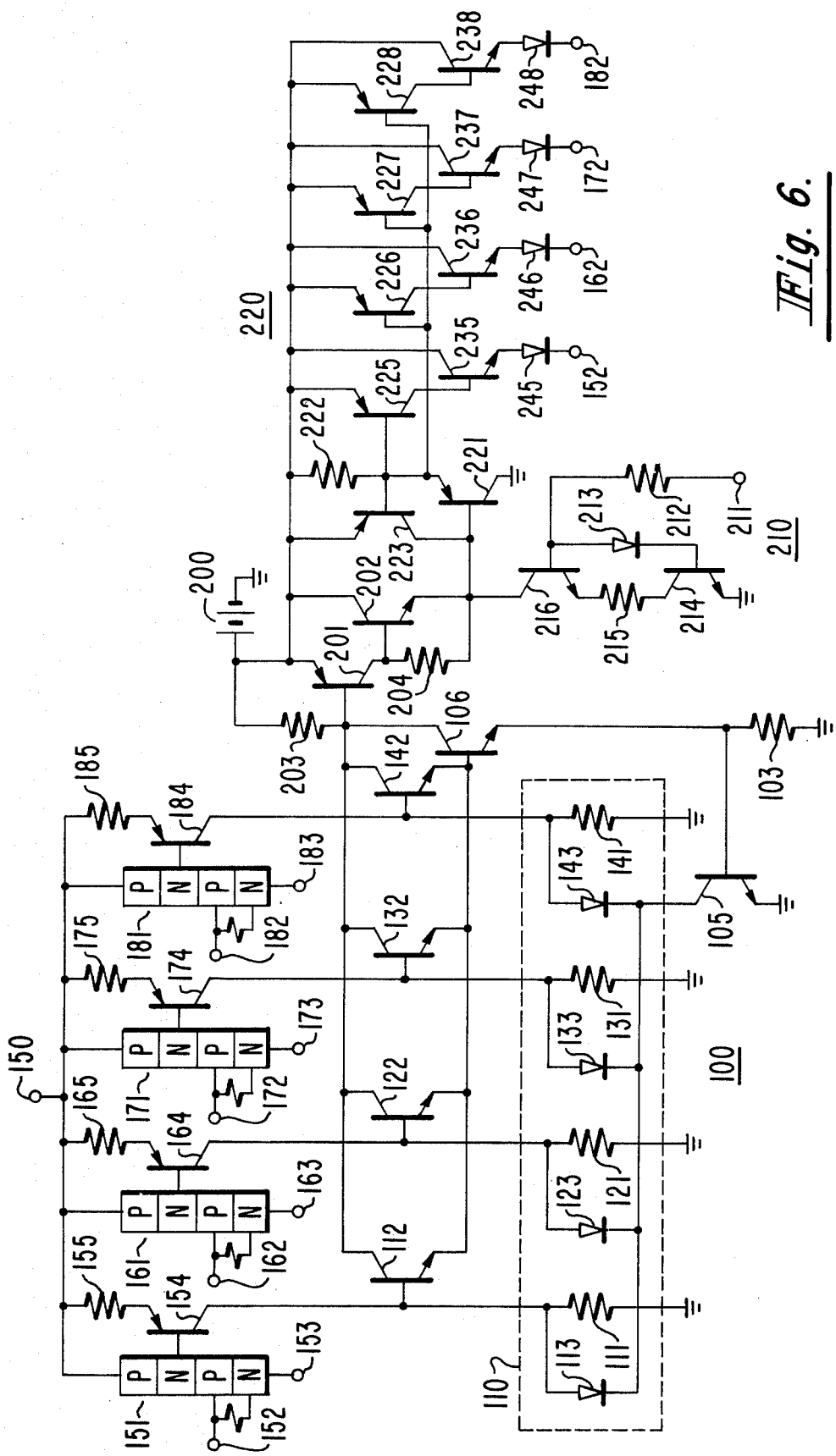
FIG. 6 is a schematic diagram of a portion of a cross-point switch including a current-mode OR gate embodying the present invention.

FIGS. 7, 8 and 9 are a plan view and first and second cross-sectional views, respectively, of a portion of an integrated circuit realization of the current-mode OR gate of FIG. 6, embodying a further aspect of the present invention; and FIG. 10 is a plan view of an integrated circuit device which is an alternative realization to that shown in FIG. 7 and embodies a still further aspect of the present invention.

Figure 1:
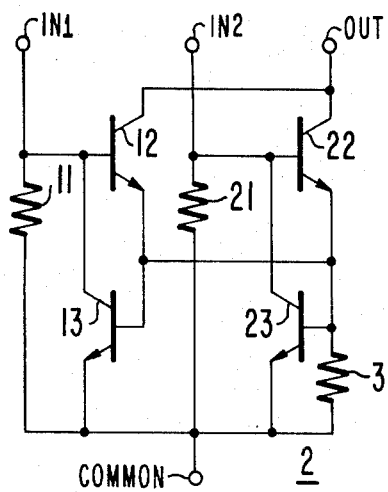
FIGS. 1 and 2 are schematic diagrams of current-mode OR gates useful in explaining the present invention.

FIG. 1 shows a basic form 2 of the current-mode OR gate. Two switched current sources (not shown) connect to the two input terminals IN1 and IN2, respectively. Each such source supplies a signal current which is in a low or ZERO state in which the current is nominally zero-valued, or in a high or ONE state in which the current has a positive value, or is in transition between the aforementioned states. The source impedance afforded by each of these current sources is at least of the same magnitude as the input impedance presented to it by the OR gate. The terminal COMMON is connected to a point of fixed potential hereafter referred to as ground. The output terminal OUT is connected to a load (not shown) providing a direct current path to an operating potential, which maintains the collector-base junctions of transistors 12 and 22 reverse biased.

Each of the transistors 12 and 22 acts substantially like a switch. The controllably-conductive path between its collector and emitter electrodes is non-conductive when the input terminal connected to its base electrode has a low-valued ZERO current applied thereto and is conductive when that input terminal has a higher-valued ONE current applied thereto.

When nominally zero-valued currents are respectively applied to each of the input terminals IN1 and IN2, they develop insufficient potential drops across resistors 11 and 21, respectively, to forward bias the base-emitter junctions of transistors 12 and 22, respectively. The resistors 11 and 21 hold the respective base potentials of transistors 12 and 22 at ground. Resistor 3 holds the emitter electrodes of transistors 11 and 21 at ground. As is well known, a transistor will not conduct unless forward-bias potential greater than a threshold value (about 550 millivolts for silicon) is applied across its base-emitter junction. Since neither transistor 12 nor 22 withdraws collector current from the terminal OUT, the output current will be substantially zero-valued. That is, the output current will be in its low or ZERO state.

Also, since the transistors 12 and 22 provide no emitter currents when ZERO input currents are supplied to terminals IN1 and IN2, there is not enough potential drop across resistor 3 to provide sufficient forward-bias potential across the base-emitter junctions of transistors 13 and 23 to bias them into conduction.

If input current to terminal IN1 is high, sufficient potential drop will appear across resistor 11 to forward bias the base-emitter junction of transistor 12 to cause collector-to-emitter current flow therethrough. The collector current of transistor 12 in response to the high current applied to terminal IN1 would, were transistor 13 non-conductive, exceed the level required to establish the output current in its high state. And, were transistor 23 non-conductive, the application of an input current in its high state to input terminal IN2 would cause the collector current of transistor 22 to be added to the output current. (The collector current of transistor 22 responds to a high input current applied to terminal IN2 in a completely analogous way to the collector current of transistor 12 responding to a high input current applied to terminal IN1.)

The amplitude of the output current in its high state is constrained to a predetermined level, however, no matter how many of the input currents are ONE's. This is done in the following manner. Since each of the collector currents of transistors 12 and 22 is related by a factor $\alpha$ (which for normal transistors exceeds be 0.97 or so) to its emitter current, their combined collector B are related by the same factor to their combined emitter currents. The combined emitter currents of transistors 12 and 22 cause a potential drop across resistor 3. If this drop exceed the 0.6 volt base-emitter voltage required to bias transistors 13 and 23 into substantial conduction, portions of the input currents respectively applied to the input terminals IN1 and IN2 are diverted through the collector-to-emitter paths of transistors 13 and 23, respectively, away from the respective base electrodes of rectangles 12 and 22. That is, transistors 13 and 23 together provide shunt regulation of the potential drop across resistor 3. Constraining the potential across resistor 3 to a maximum value, according to Ohm's Law, 44, the maximum current flow therethrough and so constrains the combined emitter currents of transistors 12 and 22. In this way, the combined emitter currents and thus the combined collector currents of transistors 12 and 22 are held at predetermined levels so long as at least one of the input currents is a ONE.

If one of the currents supplied to the input terminals IN1 or IN2 is low while the other is high, the transistor 13 or 23 connected to the high input terminal will assume the entire shunt regulation operation. The collector electrode of the other transistor is at ground potential, so that that transistor is in saturation and its collector-to-base junction is forward biased. Accordingly, resistors 11 and 21 should be chosen to have resistances about an order of magnitude larger than the resistance of resistor 3 to avoid shunting resistor 3 appreciably when transistor 13 or 23 is saturated. It may also be desirable to provide a decoupling resistor from the joined emitter electrodes of transistors 12 and 22, to each of the base electrodes of transistors 13 and 23 to reduce shunting of resistor 3 when either of the shunt regulator transistors 13 and 23 is saturated.

However, in the FIG. 1 circuit, the shunting of resistor 3 by saturated shunt regulator transistors can cause the high output current of OR gate 2 slightly to vary depending on the number of ONE's applied to its input terminals IN1 and IN2. This effect will be more evident in OR gates of this type having a larger number of input terminals. Such a gate is provided by replicating the configuration comprising IN1, resistor 11, and transistors 12 and 13 not just once with the configuration comprising IN2, resistor 21, transistor 22, and transistor 23, but more than once.

Figure 2:
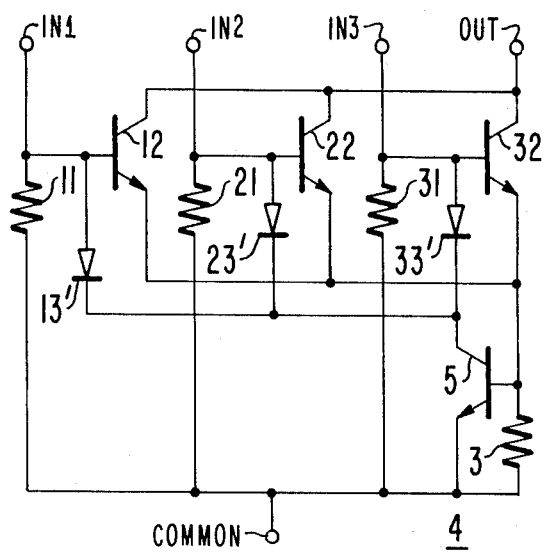

FIG. 2 shows a more sophisticated form 4 of a current-mode OR gate in which the above-mentioned problem of saturation of the shunt regulator transistor connected to an input terminal not supplied with a high input current is obviated. A single shunt regulator transistor 5 together with a steering network comprising diodes 13', 23' and 33' provides a degenerative feedback connection for maintaining the potential appearing across resistor 3 only a little larger than the threshold potential required to bias its base-emitter junction into conduction.

The potential across resistor 3 attempts to rise above this threshold potential, whenever one or more ONE's are applied to the input terminals IN1, IN2, IN3 of OR gate 4, in response to the combined emitter currents of transistors 12, 22 and 32. This biases transistor 5 into conduction and causes it to present a demand for collector current. This demand is satisfied through the one or ones of diodes 13', 23' and 33 connected to the one or ones of the input terminals IN1, IN2 and IN3 which is relatively high in potential. The one or ones of the input terminals IN1, IN2 and IN3 which will be relatively high in potential are those to which a ONE is applied. An input current in its high state will cause the potential drop across resistor 11, 21 or 31, whichever is connected to that input terminal, to be larger than the potential drop across any of these resistors connected to an input terminal only receiving a low state of input current.

In some systems (such as the cross-point subsystem described later in this specification) the current levels supplied as ONE's to the various input terminals IN1, IN2 and IN3 may differ considerably from each other. OR gate 4 accomodates these differences by the various ones of the diodes 13', 23', 33' connected to a high input terminal adjusting their relative conductances so that the amounts of input current diverted from flowing to the base electrodes of transistors 12, 22 and 32, respectively, are related in substantially the same proportions as the input currents supplied to IN1, IN2 and IN3, respectively. The proportions differ only because of the slight amounts of current flowing through resistors 11, 21 and 31. This comes about because of the exponential current versus voltage characteristics of diodes 13', 23', 33' and of the base-emitter junctions of transistors 12, 22 and 32. All these junctions double their current flow for about a 26 millivolt increase in junction potential. All of the diodes 13', 23' and 33' have their cathodes connected in common and all of the transistors 12, 22 and 32 have their emitter electrodes connected in common. This forces the increase in the emitter-to-base potential of one of the transistors 12, 22, 32 due to increased input current to its respective input terminal IN1, IN2 or IN3 to be accompanied by a corresponding increase in the cathode-to-anode potential of its respective associated diode 13', 23' or 33'. For example, if input current supplied to IN1 is twice as large as that supplied to IN2, the potential at IN1 will be about 26 millivolts higher than that at IN2. This permits base current flow to transistor 12 to be twice as large as the base current of transistor 22 and permits current flow through diode 13' to be twice as large as the current flow through diode 23'. The diodes 13', 23', 33' operate as a steering means to direct from which of the input terminals the collector current demands of the regulator transistor 5 are to be satisfied and in what proportions the input currents are to supply collector current to transistor 5.

Ones of the diodes 13', 23' and 33' which are connected to an input terminal receiving a ZERO will not be conductive. If all the input terminals IN1, IN2 and IN3 have ZERO's applied to them, none of the diodes 13', 23" and 33' will be conductive. Under this latter condition, none of the transistors 12, 22, 32 will have its base-emitter junction forward-biased. Resistor 3 will hold the base electrode of transistor 5 to ground potential preventing forward-bias of its base-emitter junction. Transistor 5 will experience no collector current flow and so presents a relatively high collector impedance. That is to say, transistor 5 is not saturated for this condition.

Transistor 5 is not permitted to saturate during times when one or more of the input terminals is supplied a ONE, either. This is achieved by making the transistor 5 large enough that its collector resistance is too low to have an appreciable potential drop thereacross at a current level equal to the sum of all the input currents at their maximum high levels.

The highest of the potentials appearing on the terminals IN1, IN2 and IN3 must exceed the sum of the base-emitter offset potential required to bias the respective threshold detector transistor 12, 22 or 32 into conduction, and of the base-emitter offset potential required to bias the shunt regulator transistor 5 into conduction, which offset potentials are each of the order of 0.6 volts for a silicon transistor. Also, the offset potential across the one of the diodes 13', 23' and 33' connected to the input terminal with highest potential, and thus forward biased by the collector current of transistor 5, is substantially the same value as the voltage across the base-emitter junction of transistor 5 when it is conductive. So, when transistor 5 is conductive, its collector electrode will be maintained at substantially the same potential (within 0.1 volt or so) as appears at its base electrode. This guarantees that the collector-base junction of transistor 5 will be reverse-biased so long as the drop across its collector resistance does not exceed 0.4 volt or so and consequently that saturation will not occur.

Both the FIG. 1 and FIG. 2 current-mode OR gates enjoy the following feature. Each of the low input currents applied to the individual terminals IN1, IN2, et seq. is prevented from being coupled through to the terminal OUT by a separate threshold detection circuit. That is, the input current applied to IN1 has to cause sufficient potential drop across resistor 11 to overcome the threshold potential required to render the base-emitter junction of transistor 12 conductive, before there will be collector current flow to transistor 12 through terminal OUT. Similarly, the input current applied to IN2 (or IN3) has to cause sufficient potential drop across resistor 21 (or 31) to overcome the threshold potential required to render the base-emitter junction of transistor 22 (or 32) conductive, before there will be collector current flow to transistor 22 (or 32) through terminal OUT. There is, then, immunity against combined low input currents erroneously causing the output current of the OR gate to appear to be high.

It should be noted that the FIG. 1 and FIG. 2 current-mode OR gates 2, 4 employ opposite logic conventions insofar as their input and their output currents are concerned. This prevents these current-mode OR gates from being cascaded directly with each other. However, they may be cascaded by means of an intervening current-inverting amplifier stage. For systems employing direct-coupled logic, a common-emitter PNP transistor amplifier or its equivalent is a suitable intervening current-inverting amplifier stage.

A feature of a current-mode OR gate according to the present invention is that no stand-by current is expended when all the input currents supplied thereto are in their low states.

Figure 3:
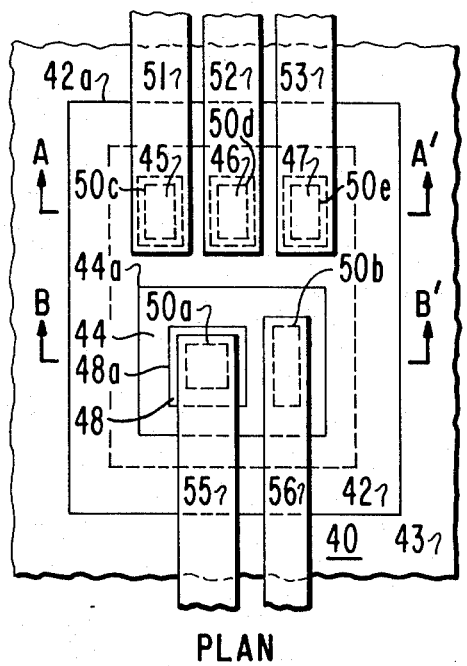
FIGS. 3, 4 and 5 are a plan view and first and second cross-sectional views, respectively, of an integrated-circuit device useful in the construction of the FIG. 2 current-mode OR gate.
Figure 4:
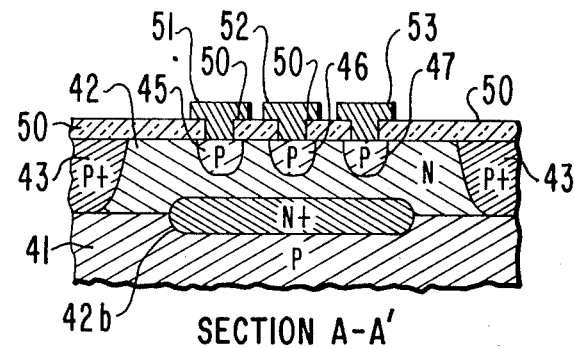
Figure 5:
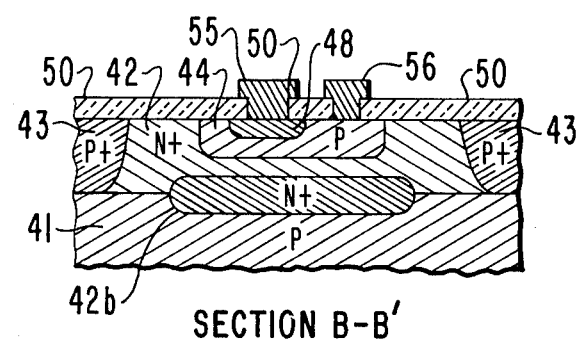

FIGS. 3, 4 and 5 are a plan and cross-sectional views of a device 40 designed for incorporation into a monolithic integrated circuit. Device 40 incorporates the transistor 5 and the steering diodes 13', 23' and 33' of the FIG. 2 circuit. In essence, the device 40 is an isolated, vertical-structure transistor differing from prior art devices in that no ohmic contact is made to its collector region. Rather, a plurality of semiconductive contacts is made to its collector region, each for providing one of the diodes 13', 23' and 33'. Otherwise, the construction of device 40 resembles that of conventional isolated, vertical-structure transistors.

More specifically, a P-type substrate 41 has an epitaxial layer 42 of N-type material thereupon. P+ diffusions 43 are used to separate this layer of N-material into isolation boats, including an isolation boat 42 having the rectangular boundary 42a. This isolation boat 42 is the collector region of the transistor 5 and may, in accordance with conventional practice, have a pocket or "buried layer" 42b of N+ material underlaying it. A base region 44 of P-type material is disposed in the collector region 42, as can e most clearly seen by reference to FIG. 5 showing a section B'-B' taken through this base region 44. Region 44 is shown in the FIG. 3 plan view to have a rectangular boundary 44a. As can be seen from FIGS. 3 and 4, a plurality of other regions 45, 46, 47 of P-type material are also disposed in the collector region 42. These regions 45, 46 and 47 have rectangular boundaries when viewed in plan as shown in FIG. 3, which respective boundaries substantially coincide with the dotted rectangular 50c, 50d and 50e, respectively. These P regions 45, 46 and 47 can be of substantially the same depth into the collector region 42 as is the base region 44 as may be determined by comparison of sections A-A', B-B' of FIGS. 4 and 5. Accordingly, the suggested practice is to form the regions 44, 45, 46 and 47 concurrently by the same diffusion or implantation process.

An emitter region 48 of an N+ material is disposed within the base region 44, as is shown in FIGS. 3 and 4. Referring to the FIG. 3 plan view, this emitter region 48 has a square boundary 48a. The device 40 as thusfar described has a layer 50 of insulative material, typically an oxide or nitride of the basic silicon material, overlaying it completely except for certain windows. A first of these windows having a square boundary 50a is above the emitter region and permits access thereto. Other windows 50b, 50c, 50d and 50e are opened above a portion of the base region 44, and above P regions 45, 46 and 47, respectively. The boundaries of these windows are seen to best advantage in the FIG. 3 plan view.

The P regions 45, 46 and 47 are each ohmically contacted through their windows in layer 50 by metalizations 51, 52 and 53, respectively, as shown in FIG. 3. Metalization 55 makes contact with the emitter region 48 through its window, and metalization 56 makes ohmic contact with the base region 44 through its window. These metalizations are conventionally formed by the evaporation of a layer of aluminum atop the layer 50 and its windows, followed by selective etching to leave only the desired metalization for electrically connecting elements in the integrated circuit.

FIG. 6 shows a current-mode OR gate 100 as connected in a cross-point subsystem of the type it was designed to be used with, which subsystem includes four SCR cross-point switches 151, 161, 171, 181. A cross-point subsystem actually manufactured has 8 SCR's used as cross-point switches.

A dashed box encompasses an array 110 of resistors 111, 121, 131, 141 corresponding in function to resistors 11, 21, 31 of the OR gates 2 and 4 of FIGS. 1 and 2. Resistors 111, 121, 131 and 141 are presumed to be fabricated as diffused resistive elements disposed in a common isolation boat. These diffused resistive elements form a semiconductor junction with their common isolation boat. Each of these junctions is a distributed element along the resistive element with which it is associated. However, the equivalent circuits of these elements can be drawn as shown with lumped-element diodes 113, 123, 133 and 143 representing the semiconductive junctions between resistors 111, 121, 131 and 141, respectively, and the isolation boat. This is because the distributed junctions will be forward-biased, if at all, only at the points along their respective resistive elements 111, 121, 131 and 141 which are most positive in potential. These points are at the ends of resistive elements 111, 121, 131, and 141 connected to the base electrodes of transistors 112, 122, 132 and 142. The common connection between the cathodes of diodes 113, 123, 133 and 143 is provided by the isolation boat itself, which is ohmically contacted and connected to the collector electrode of transistor 105.

Transistors 112, 122, 132 and 142 each form a Darlington cascade connection with transistor 106 to provide an equivalent threshold detector transistor corresponding in function to transistors 12, 22, 32 of the OR gates 2 and 4 of FIGS. 1 and 2. However, the current gain of the Darlington cascade connections is substantially equal to the product of the individual current gains of transistors 112, 122, 132 or 142 and of transistor 106, which greatly improves the sensitivity of the threshold detection function. The potential appearing across resistor 103 determines the emitter current of transistor 106 which is substantially equal to its collector current, which forms the principal portion of the output current from OR gate 100 as supplied to the base electrode of transistor 201.

More precisely, the output current which OR gate 100 supplies to the base electrode of transistor 201 comprises, in addition to the collector current of transistor 106, the combined collector currents of transistors 112, 122, 132 and 142. The combined collector currents of transistors 112, 122, 132 and 142 are substantially equal to their combined emitter currents—that is, to the base current of transistor 106. The output current provided to the base electrode of transistor 201 from OR gate 100 is then equal to the collector current of transistor 106 plus a current substantially equal to its base current. Since the emitter current of a transistor is the sum of its collector and base currents, the current supplied to the base electrode of transistor 201 by OR gate 100 is very closely equal in magnitude to the emitter current of transistor 106.

The potential across resistor 103 and hence the emitter current of transistor 106 are regulated by the shunt regulator action of transistor 105 as selectively coupled to such of the base electrodes of transistors 112, 127, 132 and 142 as are supplied high input currents. This selective coupling is by means of a steering network comprising "diodes" 113, 123, 133 and 143. This shunt regulation action is analogous to that described in connection with OR gate 4 of FIG. 2.

Four-layer diodes or silicon controlled-rectifiers 151, 161, 171 and 181 (hereinafter, each being referred to as SCR's) are the cross-point switching elements. The cross-point subsystem is of the type described in the paper "Monolithic IC Telephone Cross-Point Subsystem" co-authored by Adel A. Ahmed (the present inventor), Stephen C. Ahrens and Murray A. Polinsky as presented before the 1974 International Solid-State Circuits Conference and as appears on pages 120, 121, 238 of the Conference's *Digest of Technical Papers.* The subsystem is to be used in a row of an addressable matrix array of cross-point switching elements. The SCR's 151, 161, 171, 181 (which are preferably air-isolated from other elements on the integrated circuit chip) share a common anode connection to terminal 150 and thence to a row bus in the cross-point switch and are considered to be representative of the SCR's connected in a row of a cross-point system matrix. Each of these SCR's is connected in a separate column of the cross-point system matrix, in which column its cathode is connected to the cathodes of a number of other SCR's, each of which SCR's is included in the row of the system matrix. To this end, the cathodes of SCR's 151, 161, 171, and 181 have separate terminals 153, 163, 173 and 183, respectively, by means of which they are connected to separate column busses in the cross-point switch. The particular SCR cross-point switch to be addressed has a COLUMN DRIVE current generator connected to its column, and a COMMAND INPUT signal supplies gate currents to all the SCR's in the row the SCR being addressed occupies. The simultaneous provision of gate current and anode-to-cathode current to the addressed SCR causes it to become conductive and closes the cross-point switch, which remains closed thereafter despite removal of gate current until such time as the COLUMN DRIVE current is discontinued. The current-mode OR gate 100 is used to inhibit row addressing, which would otherwise take place in response to the COMMAND INPUT signal, whenever one of the SCR's 151, 161, 171 or 181 in that row is already conductive.

The sensing to detect when any one of the SCR's 151, 161, 171 or 181 has been rendered conductive, so the application of gating current to any of the others can be inhibited, is done by a means known in the art. The floating junctions of SCR's 151, 161, 171 and 181 are used to supply the base-emitter bias potentials for transistors 154, 164, 174 and 184, respectively. A conductive SCR will supply greater forward-bias to its associated transistor than a non-conductive SCR. Thus, the collector current of a transistor with base-emitter circuit biased from a conductive SCR will exceed the collector current of a transistor with base-emitter circuit biased from a non-conductive SCR. Transistors 154, 164, 174 and 184 are provided with emitter degeneration resistors 155, 165, 175 and 185, respectively, which provide current feedback to keep the loading presented by their respective base electrodes relatively light, so as not to divert appreciably large currents from the SCR's.

The problem is that for certain SCR designs which are advantageous to use, the collector current flow from a transistor provided forward-biasing base-emitter potential from the floating junction of an SCR is as high as 6 microamperes when the SCR is non-conductive and is as low as 20 microamperes when the SCR is conductive. Therefore, an OR function provided by simple current summing will not suffice to distinguish reliably between 1. a condition where there are three or four transistors with relatively large low state currents and
2. a condition where the transistors have relatively small low state currents and one of the transistors provides a collector current with a relatively small high state.

Furthermore, the collector current of transistor 154, 164, 174 or 184 can range upward to 100 microamperes when the SCR providing forward-bias to its base-emitter junction is conductive. With simple current summing to provide the OR function this would cause an unnecessarily large high state output current.

The current-mode OR gate 100 is particularly well suited to determining whether or not one of the SCR's 151, 161, 171, 181 is conductive. The minimum resistance in the tolerance range of the resistance of each of the resistors 111, 121, 131, 141 is chosen so that at 20 microamperes therethrough, the potential drop thereacross well exceeds 1.65 to 1.8 volt potential needed to forward-bias the serially connected base-emitter junctions of transistor 105 and of transistor 106 and of transistor 112, 122, 132 or 142, respectively. For the normally expected ± 20% tolerance on the resistance of resistors 111, 121, 131, 141 this will mean the potential drop across each of them with 6 microamperes therethrough will be insufficient to forward bias the serially connected base-emitter junctions of transistor 105, of transistor 106 and of transistors 112, 122, 132 or 142, respectively.

The respective resistances of resistors 155, 165, 175 and 185 as respectively compared to the respective resistances of resistors 111, 121, 131 and 141 are in the same ratio. Variation of the expected high current caused by the absolute resistances of resistors 155, 165, 175 and 185 departing from their nominal value are compensated for by the related departure of the resistances of resistors 111, 121, 131 and 141 from their nominal value.

The resistance of resistor 103 is chosen so that at 0.6 volt potential, approximately, maintained thereacross by shunt regulatory action of transistor 105 when one of the input currents is high, the current flow through this resistor 103 is the desired high value of output current to be supplied to the base electrode of transistor 201.

The output current of the current-mode OR gate 100 is applied to the equivalent base electrode of a composite PNP transistor comprising the cascaded PNP and NPN transistors 201 and 202. The equivalent "emitter" electrode of this PNP composite transistor is connected to the positive terminal of supply 200. Its effective "collector" electrode is connected to the input connection of a multiple-output current mirror amplifier 220. This input connection is at the base electrode of emitter-follower common-collector PNP transistor 221. Resistors 203 and 204 are high-impedance pull-down resistors to discharge the charge stored in the base-emitter junctions of transistor 201 and of transistor 202, respectively. Only when the current-mode OR gate 100 provides a high output current, is PNP transistor 201 biased into conduction, its collector current in turn biasing NPN transistor 202 into conduction to supply any collector current withdrawn by the collector electrode of transistor 216.

The configuration 210 is a threshold switch. Transistor 216 withdraws a measured collector current whenever a COMMAND INPUT signal potential at terminal 211 applied via resistor 212 to junction diode 213 and the base-emitter junction of transistor 214 is sufficiently positive to forward-bias both junctions. In response to its base-emitter junction being sufficiently forward-biased, transistor 214 saturates. During saturation, the positive collector potential of transistor 214 is brought within 0.1–0.2 volts of ground, and the impedance offered at the base electrode of the transistor is lowered, since transistor current gain is much lowered by saturation. The low base impedance of transistor 214, and the forward conduction of diode 213 brought about by base current flow to transistor 214, clamp the base electrode of transistor 216 at a clamp voltage substantially twice the forward-biased junction potential. The raising of the base potential of transistor 216 to the clamp voltage and the pulling down of the potential at the other end of its emitter degeneration resistor by the saturation of transistor 214 forward biases the base-emitter junction of transistor 216. Since the base electrode of transistor 216 is clamped to twice the forward-biased junction potential, its emitter electrode will, by emitter-follower action, be at forward-biased junction potential (about 0.6 volts). The potentials at the ends of resistor 215 are therefore determined, its resistance is of fixed known value and so the emitter current which transistor 216 must supply to support this potential drop is determined in accordance with Ohm's Law. Transistor 216 has a common-base current gain of nearly unity so its collector current is substantially equal to its emitter current.

If transistor 216 withdraws collector current in response to a COMMAND INPUT signal applied to terminal 211 and if transistor 202 is non-conductive and therefore does not provide a low-impedance path for providing this collector current, the multiple-output current mirror amplifier 220 is biased into conduction. More particularly, a portion of the collector current of transistor 216 is withdrawn as base current from transistor 221, and amplified by the common-collector amplifier action of transistor 221 to supply an emitter current. This emitter current develops a potential drop across the pull-up resistor 222 and the base-emitter junctions of transistors 223, 225, 226, 227, 228, which drop biases transistor 223 into conduction. The collector-to-base degenerative feedback provided to transistor 223 by the emitter-follower action of transistor 221 regulates the potential across its base-emitter junction to be just sufficient to cause its collector to supply the collector current demand of transistor 216 (except for a negligible portion supplied by the base-current of transistor 221) whenever this demand is not supplied from the emitter of transistor 202.

The regulated base-emitter potential of transistor 223 is applied to the base-emitter junctions of transistors 225, 226, 227 and 228 to cause them to provide collector currents each proportional to the collector current of transistor 223. The transistors 223, 225, 226, 227 and 228 may be provided with emitter degeneration resistors to improve the accuracy and reliablity of the proportions between their collector currents.

The collector current flows of transistors 225, 226, 227 and 228 in response to:
1. a COMMAND INPUT signal applied to terminal 211 causing transistor 216 to conduct and
2. to the OR gate 100 not inhibiting input current from being drawn from the multiple-output current mirror amplifier 220 are applied to the base electrodes of transistors 235, 236, 237 and 238, respectively, for amplification. The resulting emitter currents from transistors 235, 236, 237 and 238 are applied through diodes 245, 246 246, 247 248, respectively, to terminals 152, 162, 172 and 182, respectively. So, when the COMMAND INPUT signal is applied to terminal 211, gate current is furnished to each of the SCR's 151, 161, 171, 181. Whichever one of these SCR's has its cathode electrode connected to a path ending in a COLUMN DRIVE current generator will be biased into conduction, and after the COMMAND INPUT signal is no longer applied to terminal 211 the selected SCR will remain conductive.

Diodes 245, 246, 247 and 248 are preferably formed by lateral transistors, each having interconnected collector and base electrodes to serve as anode to the cathode provided by its emitter electrode. These diodes inhibit application of gate current to ones of the SCR's 151, 161, 171 and 181 which are in columns already having a conducting SCR in them. All the SCR's 151, 161, 171, 181 have their anodes connected to a potential more positive than the positive operating potential provided by supply 200. The gate electrodes of the ones of SCR's 151, 161, 171 and 181 which are conductive or which are connected in a column having a conductive SCR therein also exhibit a potential more positive than the potential afforded by supply 200. Each of diodes 245, 246, 247 and 248 connected to a gate electrode exhibiting these more positive potentials will be reverse-biased and so will not conduct current in that gate electrode.

The ones of diodes 245, 246, 247 and 248 which do not conduct current to an SCR gate electrode cause the ones of their associated NPN transistors 235, 236, 237 and 238 to be non-conductive. This, in turn causes the ones of the PNP transistors 225, 226, 227 and 228 which are not called upon to supply base current to one of the NPN transistors 235, 236, 237 and 238 to saturate. When any one of the PNP transistors 225, 226, 227 and 228 saturates, a parasitic transistor to substrate is formed which has sufficient current gain that the impedance at the base electrode of the PNP transistors is not unduly lowered. There is, accordingly, no adverse effect upon the current mirror amplifier relationship of transistor 223 and whichever of the transistors 225, 226, 227 and 228 is not saturated.

FIGS. 7, 8 and 9 show a plan view and a first and a second cross-sectional views of a portion of a monolithic semiconductor integrated circuit comprising the resistor-diode array 110 and transistor 105. Transistor 105 is of conventional construction and resembles the transistor described in connection with FIGS. 3, 4 and 5 except for the fact there are no P regions 45, 46 and 47, disposed in the N-type collector region 42' having rectangular boundary 42'a in the FIG. 7 plan view. Windows in layer 50 for providing access to these P regions are omitted. Instead an N+ region 42c is disposed in collector region 42', and a window in layer 50 as defined by boundary 50f is provided above region 42c so that metalization 57 can be ohmically contacted thereto.

Resistors 111, 121, 131, 141 are formed by P regions 61, 62, 63, 64 which are disposed as islands in an isolation boat 42". Isolation boat 42" is defined by rectangular boundary 42"a in the FIG. 7 plan view. An N+ region is disposed in isolation boat 42" under the window defined by boundary 50g and is ohmically contacted by metalization 57. Each of the P regions 61, 62, 63, 64 has a pair of windows, one at one of its extremities through which ohmic contact to ground metalization 55 is made and the other at the other of its extremities. P regions 61, 62, 63 and 64 are ohmically contacted through this latter set of windows by metalizations 51, 52, 53 and 54, respectively.

Metalization 55 is grounded, applying ground potential to each of the ohmic contacts of the P regions connected to it from a source impedance relatively small compared to the resistance of each of the P regions 61, 62, 63 and 64 as between the ohmic contacts at its extremities. Metalizations 51, 52, 53 and 54 are connected to receive selectively applied currents from the collector electrodes of transistors 154, 164, 174 and 184, respectively. The collector impedances exhibited by transistors 154, 164, 174 and 184 are relatively large compared to the resistance of respective P regions to which they connect, absent forward bias between the respective P regions and the isolation boat in which they are disposed.

An N+ region 65 may, as depicted in FIGS. 7 and 8, be disposed so as to narrow the cross-sections of the P regions 61, 62, 63, 64 perpendicular to the axis between their contacted extremities and thereby raise their resistance between those extremities. Whether this "pinch resistor" fabrication option is pursued or not does not appreciably affect the positioning of the forward-biased portions of "diodes" 113, 123, 133 and 143 which are under the relatively high potential portions of P regions 61, 62, 63 and 64, respectively, located where ohmic contact is made to metalizations 51, 52, 53 and 54, respectively.

FIG. 10 illustrates in plan view how transistor 105 and array 10 can be disposed in a single isolation boat 42''' of N-type material, which doubles as collector region for transistor 105 and as the common cathode of "diodes" 113', 123, 133' and 143'. Similarly, to the FIG. 3 device, no collector electrode need be brought out of the region 42". In some instances, a "latch up" condition may obtain in the FIG. 10 device because of lateral transistor action between the transistor base region 44 and the P regions 61, 62, 63 and 64 of resistors 111, 121, 131 and 141. The occurence of this undesirable condition depends upon the details of the particular processing used to make the devices, particularly the crystal axis of the silicon used, and the proximity of the base regions 44 to the P regions 61, 62, 63, 64. A very effective step which can cure the condition, should it occur, is not only to space region 44 somewhat further from the P regions 61, 62, 63, 64 used as resistors but also to include P+ or N+ diffusions in the portion of the N isolation boat between base region 44 and regions 61, 62, 63, 64. Sections B-B' and C-C' through the FIG. 10 device are shown in FIGS. 5 and 8, respectively.

With respect to the FIGS. 7 and 10 plan views it will be understood by those skilled in the art that the relative positioning of the P regions 61, 62, 63 and 64 and of the transistor having its collector region coupled to their isolation boat or boats may vary considerably from the specific relative positions shown.

The current-mode OR gates shown in FIGS. 1, 2 and 6 and particularly described in this specification have employed bipolar transistors, and the claims are couched in terms commonly associated with that type of transistor. However, the general configurations are applicable for use with field effect transistors since it is the transconductance rather than the current gain characteristics of the transistors which are important in the type of current logic described herein. The term "transistor" in the claims embraces field effect as well as bipolar transistors, except when details of physical structure are to the contrary.

The terms "base", "emitter" and "collector" as used in the claims include within their scope the terms "gate", "source" and "drain", respectively, commonly associated with field effect transistors, except where details of physical structure are to the contrary.

I claim:

1. Apparatus comprising:
   first and second regions being of opposite types of semiconductor material and having a semiconductor junction therebetween, said first region being provided with an ohmic contact, said second region being disposed as an island in said first region and being provided with first and second ohmic contacts at different points therein defining the ends of a resistive path through said second region;
   means exhibiting a source impedance relatively small compared to the resistance of said resistive path, for continually applying a potential to the first ohmic contact of said second region;
   means exhibiting a source impedance relatively large compared to the resistance of said resistive path, for selectively applying a first current to the second ohmic contact of said second region;
   means for selectively diverting a portion of said first current to the ohmic contact of said first region to cause conduction between said first region and said second region along at least a portion of said semiconductor junction therebetween, the portion of said semi-conductor junction that is conductive being related to the portion of said first current that is diverted; and
   means for utilizing the resulting potential appearing between the first and second ohmic contacts of said second region.

2. Apparatus comprising:
   a first region of a first type of semiconductor material, second and third regions of a second type of semiconductor material, said second and third regions each being separate from the other and adjoining the first region to form respective semiconductor junctions therewith, first and second ohmic contacts to different portions of said second region for defining the ends of a resistive path through said second region, a third ohmic contact to said third region, a fourth region being of said first type of semiconductor material and having a semiconductor junction with said third region alone of the aforesaid regions and a fourth ohmic contact to said fourth region, said first and said third and said fourth regions respectively forming the collector and the base and the emitter regions of the transistors, one of said first and said second types being N-type and the other P-type;
   means for applying a first potential which means has a source impedance relatively small compared to the resistance of said resistive path, and which means is connected to said first ohmic contact and applies its potential thereto;
   means for selectively applying a first current which means has a source impedance relatively large compared to the resistance of said resistive path, and which means is connected to said second ohmic contact and applies its current thereto;
   means for selectively applying a second current, which means is connected between said third and fourth ohmic contacts in a poling such that said second current forward biases the semiconductor junction between said third and fourth regions;
   means for connecting at least one of said third and said fourth ohmic contacts to said first ohmic contact; and
   means for utilizing potential appearing between the first and second ohmic contacts of said region responsive to said first and second currents.

3. A method of operating a monolithic integrated circuit comprising first and second adjoining regions, said first and said second regions being each of a semiconductor material and having a semiconductor junction therebetween, the second region being disposed as an island in said first region and being provided with first and second ohmic contacts at different points therein for defining the ends of a resistive path through said second region, said method comprising the steps of:
   continually applying a potential to the first ohmic contact of said second region from a source which exhibits a source impedance relatively small compared to the resistance of said resistive path;
   selectively applying a current to the second ohmic contact of said second region from a source which exhibits a source impedance relatively large compared to the resistance of said resistive path;
   selectively forward biasing at least a portion of said semiconductor junction thereby to divert at least a portion of the applied current from said second region to said first region; and utilizing the resulting potential appearing between the first and second contacts of said second region.

4. A method of operating a monolithic integrated circuit comprising first and second adjoining regions, said first and said second regions being each of semiconductor material and having a semiconductor junction therebetween, the second region being disposed as an island in said first region and being provided with first and second ohmic contacts at different points therein for defining the ends of a resistive path through said second region, said method comprising the steps of:

continually applying a first potential to the first ohmic contact of said second region from a source which exhibits a source impedance relatively small compared to the resistance of said resistive path;

selectively applying a first current to the second ohmic contact of said second region from a source which exhibits a source impedance relatively large compared to the resistance of said resistive path;

selectively diverting a portion of said first current to the ohmic contact of said first region thereby to forward bias at least a portion of the semiconductor junction between first and said second regions; and utilizing the potential appearing between the first and second contacts of said second region resulting from the conduction across a portion of said semiconductor junction, which portion is determined by the portion of said first current diverted to the ohmic contact of said first region.

5. A method of operating a monolithic integrated circuit comprising a first region of a first type of semiconductor material; and second and third regions, said second and said third regions being each of a second type of semiconductor material and having respective semiconductor junctions with said first region which they separately adjoin, said second region being provided with first and second ohmic contacts at different points therein for defining the ends of a resistive path through said second region; said third region being provided with an ohmic contact; and a fourth region being of said first type of semiconductor material, having a semiconductor junction with said third region alone of the aforesaid regions and being provided with an ohmic contact, one of said first and said second types being N-type and the other P-type, said method comprising the steps of:

continually applying a potential to the first ohmic contact of said second region from a source which exhibits a source impedance relatively small compared to the resistance of said resistive path;

selectively applying a fist current to the second ohmic contact of said second region from a source which exhibits a source impedance relatively large compared to the resistance of said resistive path;

selectively applying a second current between the ohmic contacts of said third and said fourth regions, in a direction to forward bias said semiconductor junction between said third and fourth regions, and at a relative potential, as referred to said potential applied to the first ohmic contact of said second region to cause transistor action of said third and fourth regions together with said first region thereby to forward bias at least a portion of the semiconductor junction between said first and said second regions; and utilizing the resulting potential appearing between the first and second contacts of said second region.

6. Apparatus as set forth in claim 1 wherein said means for selectively diverting a portion of said first potential includes:

a first transistor having an emitter region with an emitter electrode galvanically connected to said means for continually applying a potential, having a collector region with a collector electrode galvanically connected to the ohmic contact of said first region, and having a base region with a base electrode; and means for applying a signal between the base and emitter electrodes of said first transistor for controlling the collector current demand thereof, which collector current demand is satisfied at least in part by said portion of said first current diverted from said second region to said first region.

7. Apparatus as set forth in claim 1 wherein said means for utilizing potential appearing between the first and second ohmic contacts of said second region and said means for selectively diverting a portion of said first current together include:

a first transistor having an emitter electrode with an emitter electrode galvanically connected to said means for continually applying a potential, having a collector region with a collector electrode galvanically connected to the ohmic contact of said first region, and having a base region with a base electrode;

at least one further transistor having an emitter region with an emitter electrode galvanically connected to the base electrode of said first transistor, having a collector region with a collector electrode, and having a base region with a base electrode to which the second ohmic contact of said second region is galvanically connected; and an output terminal to which each said further transistor has its collector electrode connected.

* * * * *

UNITED STATES PATENT OFFICE
CERTIFICATE OF CORRECTION

PATENT NO. : 4,039,857

DATED : August 2, 1977

INVENTOR(S) : Adel Abdel Aziz Ahmed

It is certified that error appears in the above-identified patent and that said Letters Patent are hereby corrected as shown below:

Column 3, line 61, after "collector" delete "B" and insert --currents--.

Column 4, line 6, after "Law" delete "44" and insert --determines--

Column 6, line 65, after "can" change "e" to --be--;
line 66, "B'-B' " should read --B-B'--.

Signed and Sealed this

Twentieth Day of December 1977

[SEAL]

Attest:

RUTH C. MASON
*Attesting Officer*

LUTRELLE F. PARKER
*Acting Commissioner of Patents and Trademarks*